United States Patent [19]

Quarton et al.

[11] 4,095,235

[45] June 13, 1978

[54] RECORDING APPARATUS

[75] Inventors: William T. Quarton; Peter R. Lowe, both of Englewood, Colo.

[73] Assignee: Honeywell Inc., Minneapolis, Minn.

[21] Appl. No.: 771,022

[22] Filed: Feb. 22, 1977

[51] Int. Cl.² .............................................. G01D 9/42
[52] U.S. Cl. .................................. 346/110 R; 346/136
[58] Field of Search .......................... 346/110 R, 136

[56] References Cited

U.S. PATENT DOCUMENTS

| | | | |
|---|---|---|---|
| 2,965,434 | 12/1960 | Downs | 346/110 R |
| 3,434,158 | 3/1969 | Stauffer | 346/110 R |
| 3,754,280 | 8/1973 | Lowe | 346/110 R |
| 4,038,668 | 7/1977 | Quarton | 346/110 R X |

*Primary Examiner*—Joseph W. Hartary
*Attorney, Agent, or Firm*—Laurence J. Marhoefer; Lockwood D. Burton

[57] ABSTRACT

A display apparatus is provided whereby a constant intensity of record is obtained notwithstanding substantial changes in the linear speed of the record member. The cathode ray sweep frequency is maintained at a constant rate commensurate with the highest speed of the record member. As the speed of the record member is reduced by a given factor, the number of scans of the cathode ray beam which are unblanked are reduced by the same factor.

3 Claims, 8 Drawing Figures

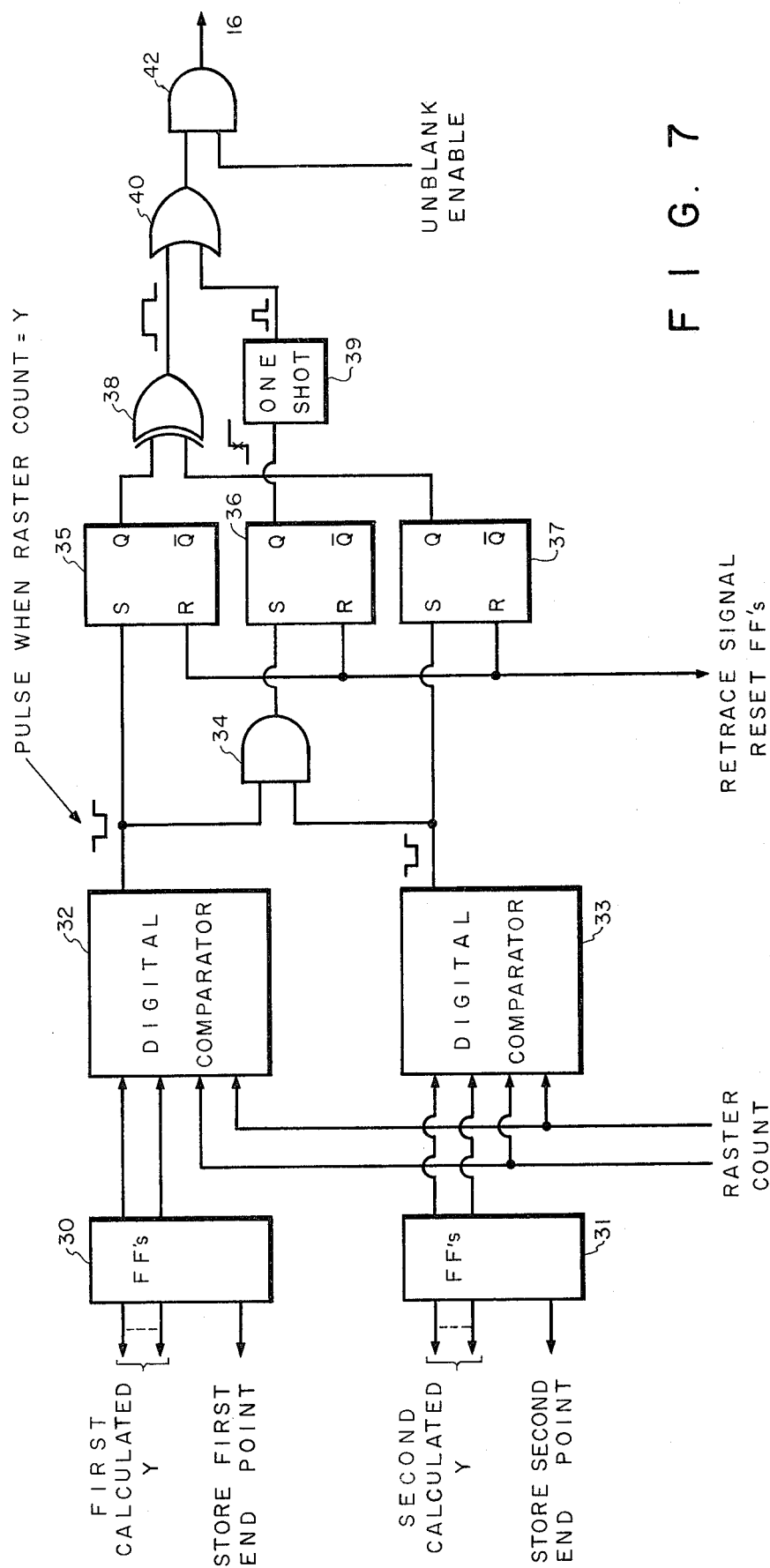

RECORDING APPARATUS

CROSS-REFERENCE TO RELATED CASE

Subject matter disclosed but not claimed herein is shown and claimed in co-pending application Ser. No. 627,794 filed on Oct. 31, 1975, now Pat. No. 4,038,668.

BACKGROUND OF THE INVENTION

1. Field of the Invention

This invention relates generally to the production of graphic displays of data signals, for example, analog physiological signals such as an electrocardiogram, and relates particularly to sampling type raster scan devices such as display cathode ray tubes or hard copy recorders.

2. Description of the Prior Art

Graphic display apparatus for providing single or multichannel analog displays and/or records of the amplitude variations of sampled analog data signals are known in the prior art. In one such known form of apparatus, the curves or traces, as plotted on the screen of a cathode ray tube (CRT), comprise a multitude of separated elements or dots instead of continuous lines or traces. Specifically, the plotting of such traces is effected by momentarily unblanking a normally blanked cathode ray beam at points along the successive scan or sweep paths which form the raster, depending upon the amplitudes of the sampled input analog data signals under measurement. Traces of this kind comprising many dots on the screen of the CRT obviously present difficulties in interpretation and analysis.

In another such known form of apparatus, graphic displays are produced from intermittently sampled analog data signals by a so-called connected sampling method that yields substantially continuous, and hence, more discernible curves, notwithstanding the intermittent nature of the sampled data from which the curves are produced. In this form of apparatus, the traces are obtained by producing successive substantially parallel lines on a display medium, for example, a photosensitive record sheet that is arranged to move past the face of a CRT that is operated in a line scan mode. Each of such lines extend between two points on each of the successive sweeps of the cathode ray beam. Between these two points the beam is unblanked. The positions of the points represent, respectively, a corresponding two, consecutively derived ones of the sampled data values. A requirement of this prior art apparatus is that a sampling and comparison step be performed for each sweep and displayed line constituting the trace. An example of a method and apparatus for producing such a connected sampling graphic display from intermittently sampled analog data is shown in U.S. Pat. No. 3,605,109 that was issued on Sept. 14, 1971 to Peter R. Lowe and Tommy N. Tyler.

Display apparatus in which the variations in a sampled measured analog data value are converted to digital measured quantities which are stored in a suitable memory before being displayed is also known in the art. Such apparatus provides a display of the variations over a period of time of the analog data value. In such apparatus the sampled measured analog values are stored as individual digital values or data points in an image repeating or recirculating memory. An example of such an apparatus is shown in U.S. Pat. No. 3,653,027 that was issued on Mar. 28, 1972 to David W. Scheer. As there disclosed, an analog-to-digital converter is provided to convert the sampled derived to digital measured quantities. The digital information is recirculated in the memory at a much higher rate than that at which the measured digital values are entered into the memory. Blocks of information are read out of the memory at the memory recirculating frequency. The blocks of information, as read out, are converted back to analog form by a digital to analog converter and are then presented to the circuit of a cathode ray tube through a comparing means. The cathode ray tube circuit includes a high speed vertical sweep signal and a low speed horizontal sweep signal means. A beam intensity or so-called Z-axis modulation means is activated when the comparing means senses a substantial equality between the analog signal to be displayed and a reference signal related to the high speed sweep signal. Specifically, a normally blanked cathode ray tube beam in unblanked momentarily, when a digital measured value is delivered from the memory, at a position along a vertical sweep or raster line dependent upon the value of the measured value. The representation of the variations in the analog data value appears upon the screen or face of the cathode ray tube as illuminated dots or light points.

A disadvantage of such prior art apparatus is that the dots or light points do not provide smooth and continuous traces or curves. Smoothing out of the traces or curves to make them appear more continuous could be accomplished by providing a raster with more closely spaced lines. While this is a possible solution, it is subject to a serious disadvantage. This is because of the requirement, with the prior art apparatus, even if the aforementioned connected sampling techniques were employed, that each raster line must correspond to a data point in the digital memory. That is to say, with the prior art apparatus, the memory must store a data point or value for each raster line. Thus, the larger the number of raster lines that are provided, the larger the memory must be. Thus, the cost of the memory is increased in proportion to the number of raster lines. Since memory is expensive, the provision of more closely spaced raster lines to the known prior art apparatus to achieve smoother and continuous traces or curves has added significantly to the cost of the apparatus.

A further difficulty encountered in prior art apparatus is that if the beam intensity of the cathode ray tube is set at a value to produce a satisfactory image on a record member at a selected speed of linear motion of the record member, when the speed of the record member is changed, the image becomes unsatisfactory. If the system is adjusted to give a good image at the highest selectable speed of the record member, when the speed of the record member is reduced by a known factor, the image on the record member becomes overexposed and overlapped. On the other hand, if the system is arranged to produce a good image at a lower speed, when the record member is driven at a higher speed the image will be underdeveloped and sparse.

SUMMARY OF THE INVENTION

Accordingly, it is an object of the present invention to provide an improved method and apparatus for producing graphic display records from a scanning recorder.

It is another object of the present invention to provide an improved method and apparatus as set forth characterized in the provision of a constant intensity record irrespective of the linear speed of the record member.

In accomplishing these and other objects, there has been provided, in accordance with the present invention, a graphic recorder of the scanning type wherein the system is adjusted to produce a good image at the maximum speed of the record member with an unblanking signal being applied to each scan line of the recording beam in accordance with applied data signals. Then, when the linear speed of the record member is reduced by some predetermined factor, the number of scan lines of the recording beam to which an unblanking signal is applied is reduced by the same factor. The same factor is applied to the extraction of data from a controlling memory unit whereby no data is lost in the reduction of the number of scan lines.

BRIEF DESCRIPTION OF THE DRAWINGS

A better understanding of the present invention may be had from the following detailed description when read in connection with the accompanying drawings wherein:

FIG. 7 is a block diagram of the circuit for the digital beam comparator shown in FIG. 1.

DESCRIPTION OF THE PREFERRED EMBODIMENT

Figure 1:
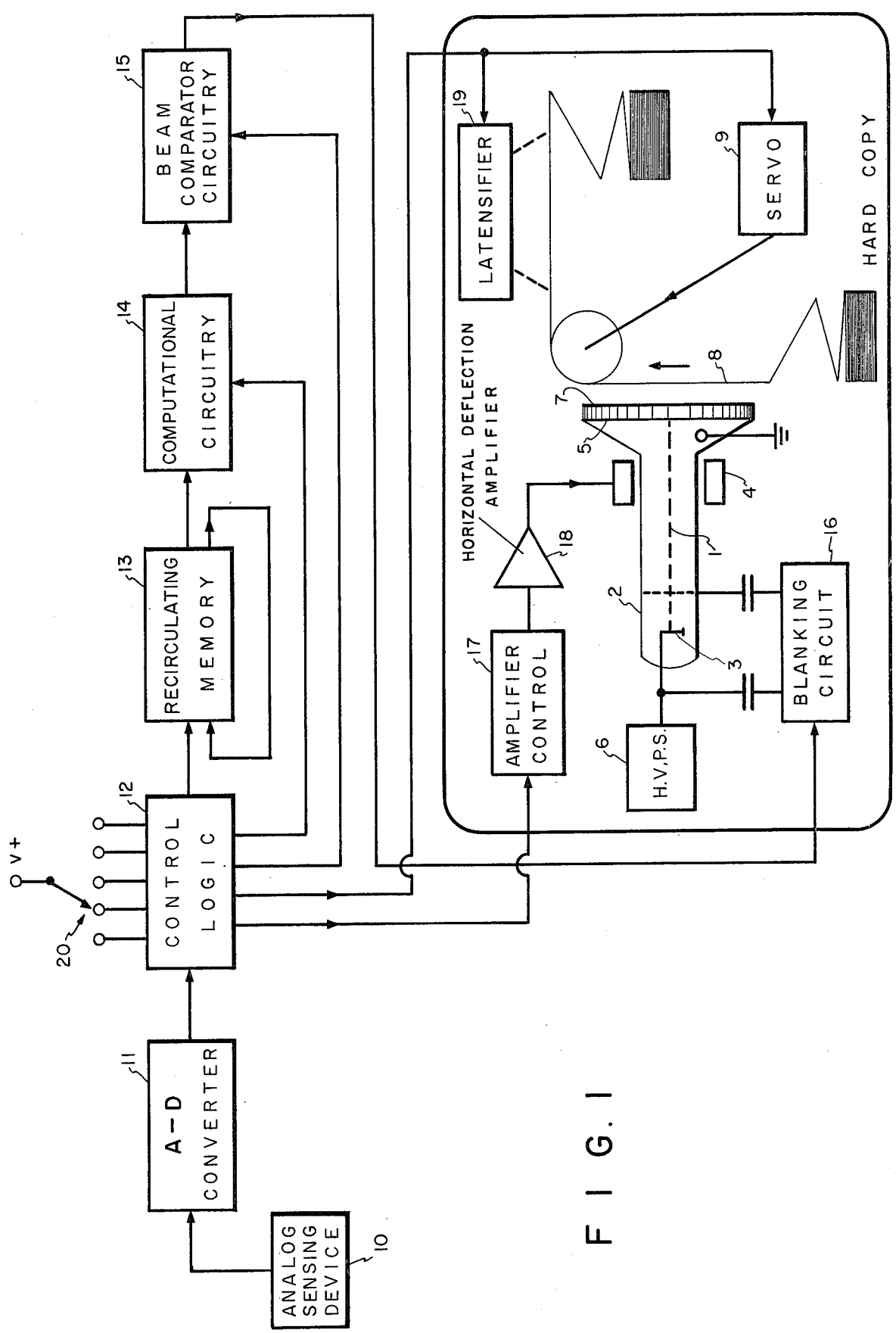
FIG. 1 is a diagram of a single channel display-producing apparatus according to the present invention operating according to the novel method thereof.

In FIG. 1, there is shown the path 1 of a cathode ray or electron beam of a CRT 2 that is operated in a line scan mode, a Z-axis modulation or beam intensity controlling cathode cathode 3, horizontal deflection plates 4, a display screen 5 and a source of high voltage 6. The CRT 2 also includes a fiber optics array or strip (not shown) that is incorporated into the faceplate 7. A photosensitive record sheet 8 is advanced by a suitable servo 9 at a predetermined rate upward, as seen in FIG. 1, past the fiber optics strip from a supply of the photosensitive record sheet.

An analog signal to be displayed, for example, an electrocardiogram signal derived from a sensing device 10, is applied to an input terminal of an analog to digital (A-D) converter 11. The A-D converter output is connected to a suitable control logic circuitry 12 then to the input of an image repeating or recirculating memory 13. The output of the recirculating memory 13, comprising 10 lines, although not shown in FIG. 1, is connected to the input of an interpolation computational circuitry 14.

The output of the computational circuitry 14 is connected to the input of a digital beam comparator circuit 15. The output of the digital beam comparator circuit is applied to a blanking circuit 16 for the cathode ray beam of the CRT 2.

Horizontal synchronizing pulses for causing repetitive sweeping of the cathode ray beam along the aforementioned fiber optics strip are supplied to the horizontal deflection plates 4 under the control of the control logic circuitry 12. To that end, an output of circuit 12 is connected to the input of an amplifier control 17. The output of amplifier control 17 is connected to the input of a horizontal deflection amplifier 18. The output of the latter is connected to the horizontal deflection plates 4 of the CRT 2. The cathode ray or electron beam is repetitively swept by the horizontal deflection plates 4 along the fiber optics strip of the CRT 2. Normally, the cathode ray beam is blanked and, unless unblanked, the signals applied to the horizontal deflection plates are not effective to produce marks or traces on the photosensitive sheet 8. The cathode ray beam is arranged to be selectively unblanked under the control of the blanking circuit 16 which, in turn, is controlled by the beam comparator circuit 15. A latensifier 19 is provided to latensify the latent images produced on the photosensitive sheet 8 in a manner known in the art. The intensity of the radiation produced by the latensifier is controlled by the logic circuit 12 in accordance with the speed at which the photosensitive sheet 8 is moved past the faceplate of CRT 2. As shown in FIG. 1, a manual control device, for example, a selector switch 20, is provided for the logic circuit to facilitate adjustement in the speed of the photosensitive sheet 8.

While only a single channel is shown in FIG. 1, it will be understood that the CRT 2, which may be a large screen CRT, may be employed to service a number of different channels of data sequentially. Information for this channel of data as well as for other channels, when provided, is stored in the recirculating memory 13 and is selectively played out responsively to signals applied thereto by the control logic circuitry 12.

The block diagram of FIG. 1 shows the essential features required for one channel. The incoming data on the input of A-D converter 11 is digitized, for example, to 10 bit resolution, at a constant high rate which may be 7 Khz. This data goes into the control logic circuitry 12 which outputs one word of data at a rate determined by the paper speed, and which may be as high as 700 Hz. or as low as several Hz., for example, 3.5 Hz.

Words representing adjacent sampled data values in the memory 13 are applied to the input of the interpolation computational circuitry 14 at a rate demanded by the speed at which the photosensitive sheet 8 is moved past the faceplate of the CRT 2. The computational circuitry 14 is operative, in a manner described hereinafter, to calculate, at a rate determined by the paper speed, several successively increasing or decreasing values intermediate the last two values presented to its input by the recirculating memory 13. The last-mentioned values including the calculated intermediate values are applied in sequence to the input of the beam comparator circuitry 15. The output of the latter is applied to the blanking circuit 16 and presented thereby to the beam controlling cathode of the CRT 2. At the same time, as noted, the horizontal axis is swept, desirably although not necessarily, in a linear fashion. The resulting path of the cathode ray beam of the CRT 2 and the display provided thereby is illustrated in FIGS.

2A and 2B for a typical analog input signal applied to the input of the A-D converter 11.

Figure 2A:
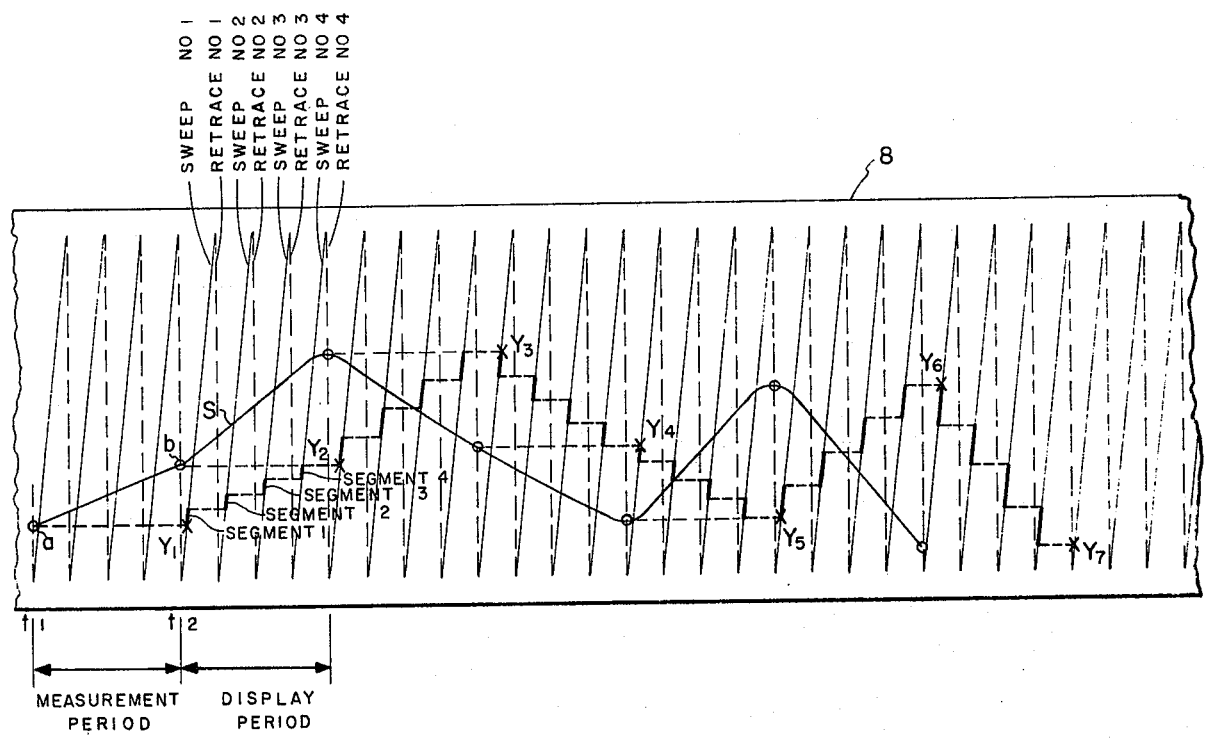
FIG. 2a is a graphic representation which illustrates the nature of the curves produced according to the method and apparatus of the present invention with a recording medium traveling at maximum speed.

In FIG. 2A, there is shown the recording on photosensitive record member 8 of the analog signal, applied by the device 10 to an input terminal of the A-D converter 11, obtained by the recording technique according to the present invention with the record member 8 being driven at a maximum linear speed. As seen in FIG. 2A, the series of light, solid lines identified as Sweep No. 1, Sweep No. 2, etc. represent successive scan or sweep paths of the cathode ray beam along the length of the fiber optics strip of the CRT 2, assuming time to be increasing toward the right. The dash lines between the sweep paths, identified as Retrace No. 1, Retrace No. 2, etc. represent the retrace, return, or flyback paths of the beam. For purposes of illustration, the lines have been shown with greatly exaggerated spacing along the time axis.

The heavy line indicated by the letter S in FIG. 2, represents the actual values of the analog data signal under measurement with respect to time, that is, the varying signal derived from the sensing device 10, as seen in FIG. 1. The line segments shown in heavy lines along Sweep Nos. 1 through 4 show the line segments produced on the screen of the CRT 2 as the electron beam is unblanked during the successive sweeps of the beam. It is noted that these segments are produced in an indicating or display period that follows a measurement period in which the signal representing the data signal is measured. Thus, the lowest value of the data signal at the time $t_1$ is shown as equal to the value at point $Y_1$ of the line segment along Sweep No. 1. The value $b$ of the data signal at time $t_2$ is shown as equal to the maximum value of the line segment along Sweep No. 4. The length of the line segments along each of Sweep Nos. 1 through 4 are equal to one-fourth of the vertical distance between points $Y_2$ and $Y_1$. If the distance $Y_2 - Y_1 = Y$, then the length of the line segments is equal to $\Delta Y/4$, as shown in FIG. 2. This introduction of a plurality of line segments between the points Y1 and Y2 provides significantly better display resolution, as those skilled in the art will readily understand. Additionally, the introduction of the intermediate line segments contributes significantly to the smoothness and continuous appearance of the race or curve formed by the successive line segments on the photosensitive sheet 8.

Figure 2B:
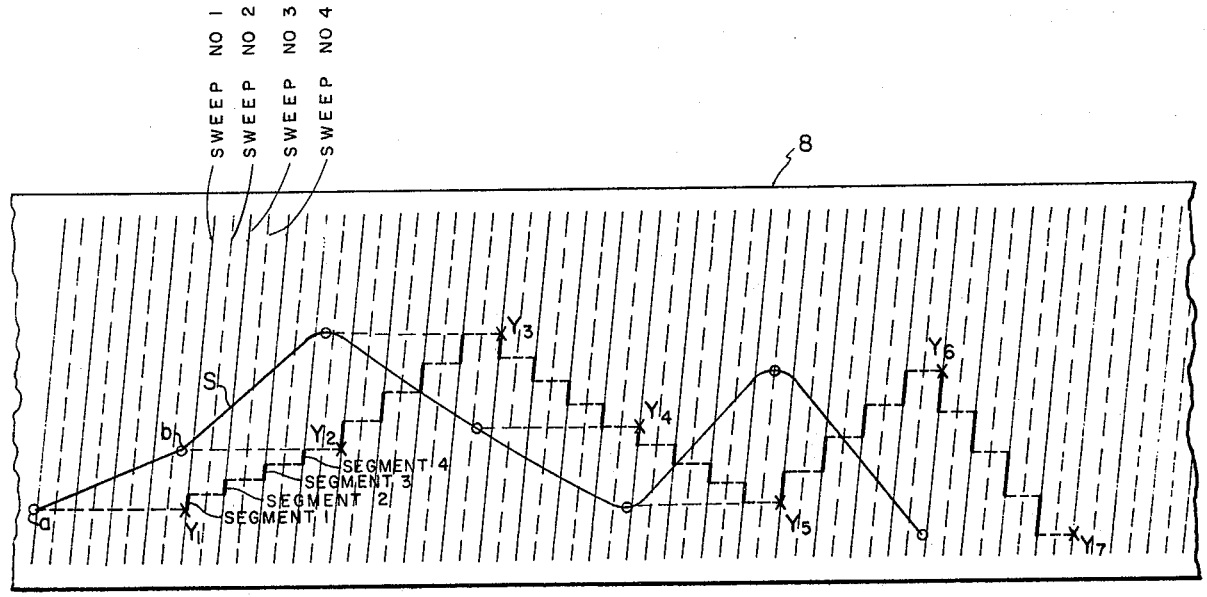
FIG. 2b is similar to FIG. 2a but illustrating the operation of the system with the record medium moving at half maximum speed.

In FIG. 2B, on the other hand, there is shown a recording substantially identical to that of FIG. 2A but with the record member 8 being driven at one-half the linear speed of the record member 8 in FIG. 2A. In FIG. 2B, the representations of the retrace lines have been omitted to avoid confusion. A comparison of the two figures shows that with the scanning frequency of the beam held constant, the trace lines on the record member moving at half the speed would be separated by half the distance of those on the record member moving at the higher speed. If, as in the case of the higher speed, there were to be an unblanking signal applied to each scan line of the beam, the record trace on the record member would be compressed by a factor of two. As was previously noted, the separation between the successive scan lines is greatly exaggerated for clarity. In practice, the race or scan lines in the FIG. 2A configuration are sufficiently close as to give the appearance that the line segments comprise a continuous line. Therefore, halving the separation distance as in FIG. 2B would produce an effective overlapping of the trace marks and result in an overexposure of the photosensitive record member, especially at the maxima and minima.

In order to obviate the foregoing difficulty, as may be seen from FIG. 2B, when the speed of the record member is reduced by a factor of two, the number of the scan lines to which an unblanking signal is also reduced by a factor of two. In other words, in the arrangement of FIG. 2B, an unblanking signal is applied to alternate scan lines with a blanked scan line in between. This arrangement maintains the same density and intensity of the recording at either speed.

Similarly, if the speed of the record member is reduced by a factor of four, eight, etc., the number of scan lines to which an unblanking signal would be applied is also reduced by the same factor. This is, for a speed reduction by a factor of four, an unblanking signal will be applied only to every fourth scan, with three blanked lines in between. To illustrate that point in FIG. 2B, wherein the speed and the unblanking are reduced by a factor of two, alternate scan lines of the recording beam are shown in dotted line form, representing those scans of the beam to which no unblanking signal is to be applied. The fine solid lines represent the alternate scans of the recording beam to which the unblanking signals are to be applied; the heavy line segments being representative of the actual application of the unblanking signal in accordance with the input data signal.

Figure 3:
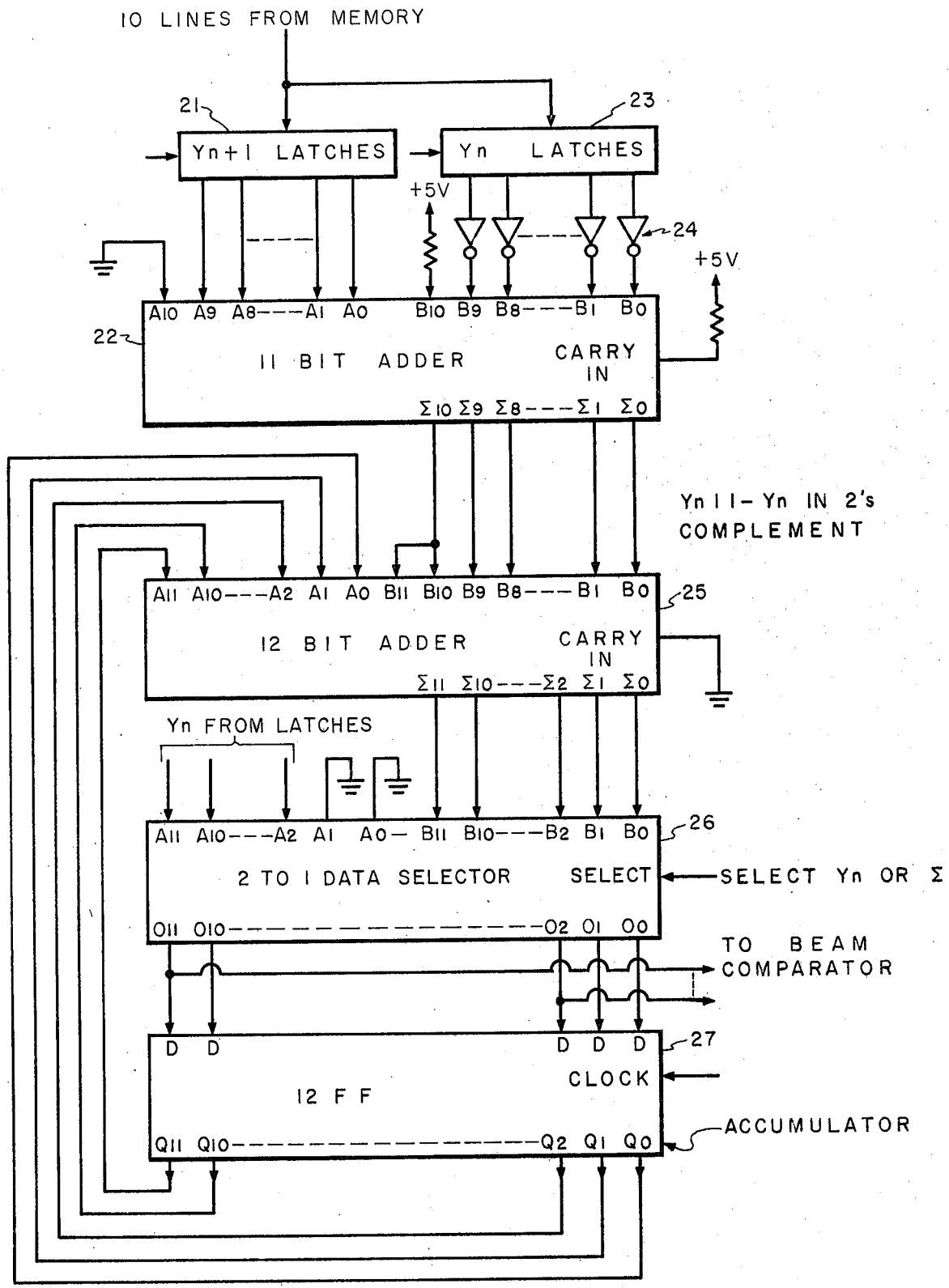
FIG. 3 is a block diagram of a logic circuit for effecting the interpolation computation in the apparatus of FIG. 1.

The circuit 14 of the FIG. 1 apparatus for effecting the interpolation computations is illustrated in FIG. 3. As seen in FIG. 3, ten lines from the output of the recirculating memory 13 are connected to the inputs of two sets of latches 21 and 23. Each set of latches includes ten latches, each of which may of D flip-flop form. The ten lines from the outputs of the latches 21 are connected to input terminals designated $A_0 - - - A_9$ of an 11 bit adder indicated at 22. The ten lines from the output of the latches 23 similarly are connected to the input terminals $B_0 - - - B_9$ of the adder 22. The 10 lines from the latches 23 to the adder 22, however, each include an inverter 24.

The latches 21 are arranged to transmit to the adder 22 a digital representation of a first data point, for example, that designated $Y_2$ in FIG. 2A, stored in the memory 13. Similarly, the latches 23 and the associated inverters 24 are arranged to transmit to the adder 22 a digital representation of an adjacent data point, for example, that designated $Y_1$ in FIG. 2A, stored in the memory 13. To this end, activating signals are sequentially applied to the sets of latches 23 and 21 in synchronism with the successive outputting by the recirculating memory 13 of the digital representations of adjacent data points. The activating signals are applied to the latches 23 and 21 and to the recirculating memory 13 from the control logic circuitry 12 as determined by the speed selection for the record member.

The function of the apparatus of FIG. 3 is to respond to the digital representations outputted by the memory 13 of adjacent pairs of data points to produce a plurality of intermediate digital representations of data points intermediate each of said pairs of data points. Such intermediate digital representations comprise the aforementioned interpolated or virtual values. For convenience, the pairs of adjacent data points will hereinafter be referred to as $Y_n$ and $Y_{n+1}$ and are so indicated in FIG. 3.

Figure 4:
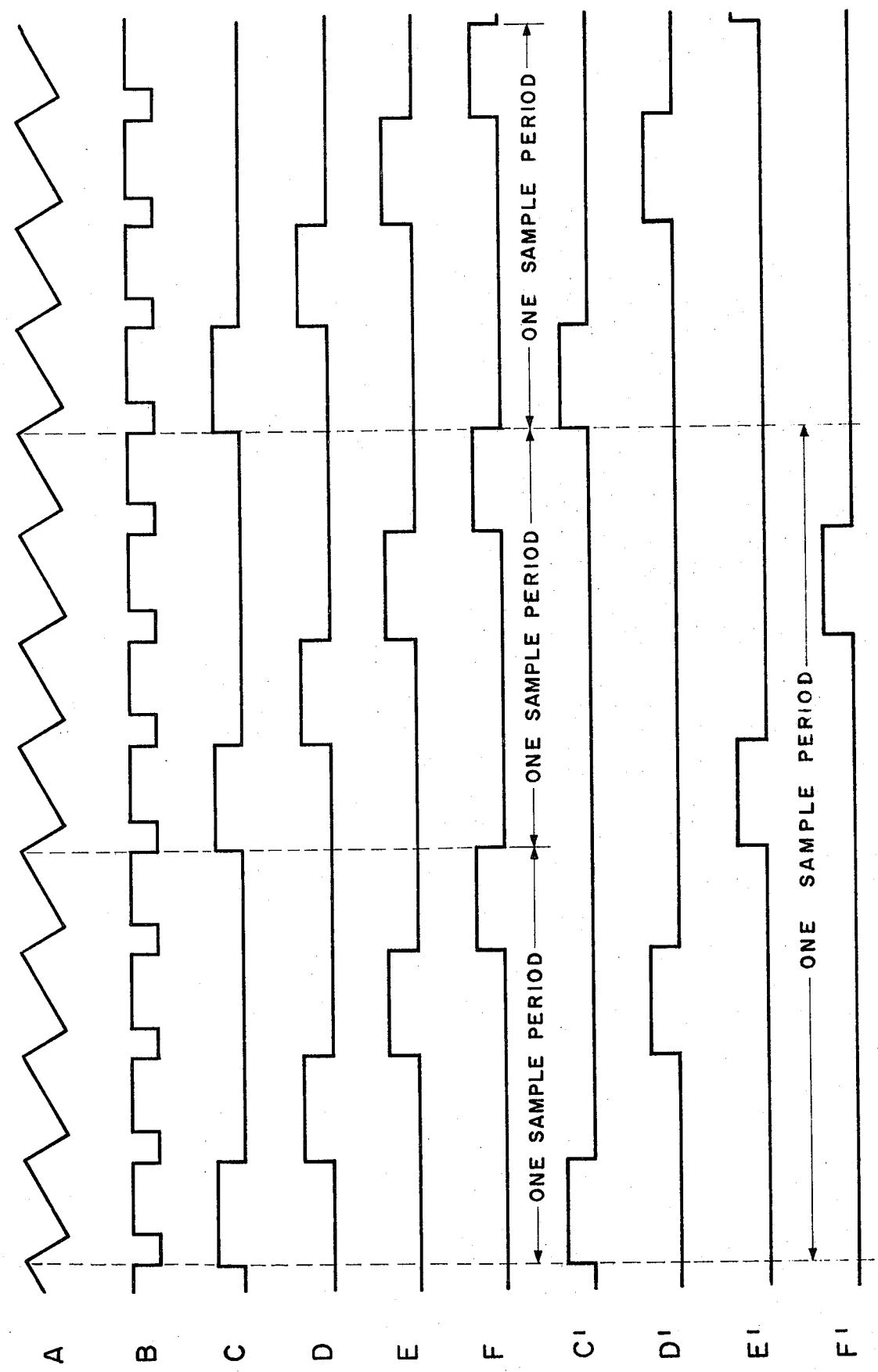
FIG. 4 is a chart showing relative timing lines illustrating the operation of the apparatus in accordance with the present invention.

The digital representation $Y_n$ is first stored in the latches 23 and then the digital representation $Y_{n+1}$ is stored in the latches 21. Both of these storage operations and the outputting of information by the memory 13, are accomplished during a retrace period of the cathode ray beam 1 of CRT 2 when it has been determined, as hereinafter described, that new data points and, therefore, new interpolated line segments, are desired. It will be seen by reference to FIGS. 2A and 4 that each of the successive line segments are produced during an individual sweep of the cathode ray beam for maximum speed of the record member. FIG. 4 shows the clock timing diagram for the beam comparator circuitry 15. Each such sweep is effected between counts 0 and 1023 of a divide by 1140 counter, not shown, but embodied in the update control logic circuitry 12. The said counter provides suitable activating signals through a speed correlated frequency divider to the latches 21 and 23 whereby the storage of the digital representations of $Y_n$ and $Y_{n+1}$ and successive new digital representations are stored in the respective latches 23 and 21 after every fourth effective sweep, during the retrace period, that is, between counts 1024 and 1139 of the counter. Count 1140 of the counter is a reset count for the counter. The digital representations of the data value pairs, $Y_n$ and $Y_{n+1}$ remain stored in the latches during the display period for those data value pairs, that is, through four successive sweeps of the cathode ray beam. During the retrace period comprising counts 1024 through 1139 of the counter following each such display period, new values of adjacent data points, $Y_n$ and $Y_{n+1}$, of the data stored in the recirculating memory are stored in the latches 23 and 21. These values, as noted, remain stored in the latches through four successive sweep periods, each comprising counts 0 through 1023 of the counter, and the times of the intermediate retrace periods needed to display four line segments. This action is continually repeated.

In the operation of the FIG. 3 apparatus, the 11 bit adder 22 operates to subtract $Y_n$ from $Y_{n+1}$ to determine the difference, designated $\Delta Y$, between the said two values. The eleven bit adder 22 may be of known type and provides the result of $Y_{n+1}$ minus $Y_n$ in 2's complement. The adder 22 has the carry input set at a logical 1 to provide 2's complement subtraction. The 2's complement, as is known, provides a representation of the difference between $Y_{n+1}$ and $Y_n$ in positive and negative values. This, $\Delta Y$ may be represented as a positive number or it may be a negative number. The 2's complement defines whether the number is positive or negative and also provides the value of the number.

As seen in FIG. 3, the summation output terminals $\Sigma 0$ through $\Sigma 10$ of the 11 bit adder 22 are applied to the $B_0$ through $B_{11}$ input terminals of a 12 bit adder 25. The $B_{10}$ and $B_{11}$ terminals of the adder 25 are connected together. The summation output terminals $\Sigma 0$ through $\Sigma 11$ of the adder 25 are connected to the input terminals $B_0$ through $B_{11}$ of a 2 to 1 data selector. The output from latches 23 is directly connected, that is, independently of the inverters 24, to the $A_2 --- A_{11}$ inputs of the data selector 26. Thus, the digital representation of data point $Y_n$ is applied directly to the last-mentioned inputs of the data selector 26. The output terminals $O_0$ through $O_{11}$ of the data selector 26 are connected to the input terminals of an accumulator 27. The latter comprises 12 flip-flops. The output terminals $Q_0$ through $Q_{11}$ of the accumulator 27 are connected in a feedback manner to the input terminals $A_0$ through $A_{11}$ of the 12 bit adder 25. Additionally, as seen in FIG. 3, the output terminals $O_2$ to $O_{11}$ of the data selector 26 are connected to the input of the beam comparator circuitry 15.

Activating control signals are applied to the data selector 26 and the accumulator 27 from the control logic circuitry 12. These signals are applied during the selected retrace periods of the cathode ray beam 1 of CRT 2. Upon the assumption that the data selector is gating the output of the adder 25 to the input of accumulator 27, then the adder 25 is adding $\Delta Y/4$ to what is in the accumulator. Clocking the accumulator 27 loads in what was previously in the accumulator plus $\Delta Y/4$. The carry input into adder 25 is held at logical "0", grounded, to provide normal addition.

Figure 5:
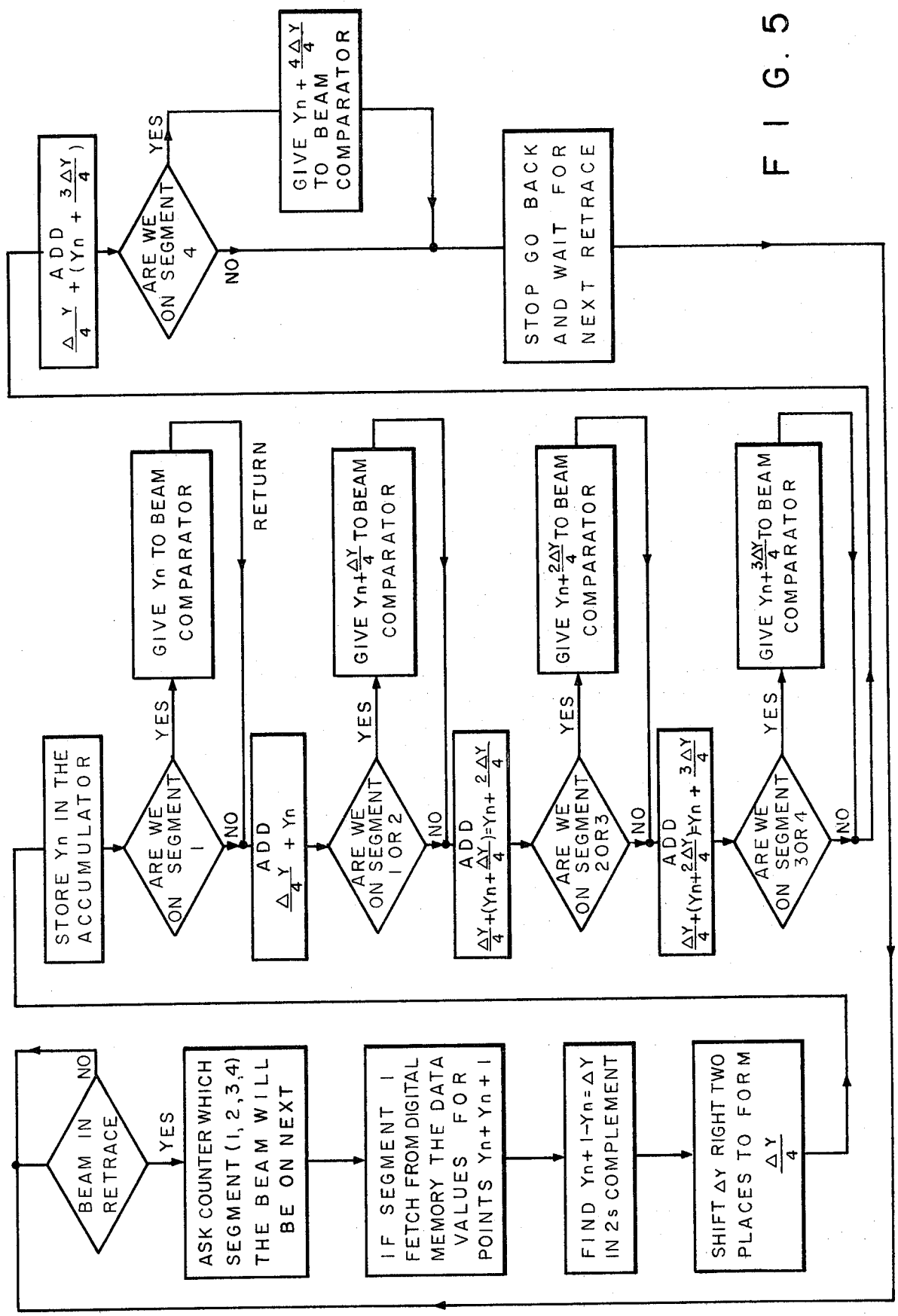
FIG. 5 is a flow chart illustrating the algorithm for the computational circuit of the FIG. 1 apparatus.

Referring now to FIG. 5, there is shown a flow chart which illustrates symbolically the manner in which the computational circuitry 14 generates successive words representative of the intermittent and successive line segments $\Delta Y/4$ along the successive traces commensurate with the effective sweeps as is seen in FIGS. 2A and B. For convenience of illustration, the segments along the successive effective sweeps have been designated segment 1, segment 2, segment 3 and segment 4. As noted, all of the segments between the adjacent data points $Y_n$ and $Y_{n+1}$ or between the data points $Y_1$ and $Y_2$, $Y_2$ and $Y_3$, as shown in FIG. 2 are of equal length. Thus, the segments during successive display periods may be similarly designated, and in any particular display period, the segments also are all of the same length. The actual length of the segments in different display periods will depend upon the vertical distance between the successive data points, for example, $Y_3 - Y_2$, $Y_4 - Y_3$, etc., as seen in FIG. 2A.

Specifically, by reference to FIG. 5, it will be seen that the algorithm first inquires as to whether the counter of the control logic circuitry 12 is in effective retrace, that is, counts 1024 through 1139 of the divide by 1140 counter. If not, the apparatus illustrated in FIG. 3 waits until the counter is in such retrace. If the apparatus is in retrace, the value of new line segments may require calculation. The next inquiry is to determine which segment (1, 2, 3 or 4) the beam will be on next. Having made a determination that the next such line segment is the first, the algorithm then provides for fetching from the recirculating digital memory 13 the data values for the points $Y_n$ and $Y_{n+1}$. This results in the generation of a signal from the logic circuitry 12 to provide the sequential outputting of the data signals $Y_n$ and $Y_{n+1}$ from the memory 13 and their storage in the latches 23 and 21, respectively. From there, they go into the 2's complement adder 22. The algorithm then provides for the determination of $Y_{n+1}$ and $Y_n$ to provide $\Delta Y$ in 2's complement. This representation comes out of the adder 22. Following this determination and activation, the algorithm specifies shifting Y to the right two places to determine $\Delta Y/4$. This operation is performed by the inputs to the 12 bit adder 25. As is known, in binary notation, the shifting of a number to the right results in actual division of the number by two each time such a shift is made.

By reference to FIG. 3, it will be seen that the extreme right bit of $Y_n$ comes into terminal $B_0$ of adder 22 and comes out of $\Sigma 0$. This bit continues on down to the output terminal on the extreme right of the data selector 26, as seen in FIG. 3. The digital word, however, that is fed to the beam comparator 15 is taken from the output terminal $O_2$ to the output terminal $O_{11}$ of the data selector 26. The two right-hand bits $O_0$ and $O_1$ are omitted. Taking $Y_n$ applied to input terminals $A_2$ through $A_{11}$ of data selector 26, and having the $\Delta Y$ over at the right 10 bits is equivalent to a shift to the right of two bit positions. $\Delta Y$ thus is shifted to the right by two places by the 12 bit adder 25. The first value needed in the accumulator 27 is $Y_n$. This value can be added to the value $\Delta Y/4$. The way $Y_n$ is stored in the accumulator 27 is by means of the 2 to 1 data selector 26. Thus, as seen in FIG. 3 and as was previously mentioned, the value $Y_n$, directly out of the latches 23 is connected into the input terminals $A_2$ through $A_{11}$ of the data selector 26. The connection of this digital representation is into the 10 left bit positions. The two right bits $A_0$ and $A_1$, are 0. This corresponds with the digital word that is to be applied to the beam comparator 15.

Having effected the storage of $Y_n$ in the accumulator, the next inquiry of the algorithm is, as seen in FIG. 5, the apparatus about to produce the first trace segment of a display period, that is, segment 1. If so, the digital word representing $Y_n$ is given to the beam comparator 15. Then the algorithm provides for the addition of $\Delta Y/4$ to $Y_n$. The next inquiry is whether the apparatus is about to produce segment 1 or segment 2. If in the affirmative, the digital word to $Y_n + \Delta Y/4$ is given to the beam comparator. Next, the value $\Delta Y/4$ is added to the quantity $Y_n + \Delta Y/4$ to provide the digital representation for $Y_n + 2\Delta Y/4$. Again, an inquiry is then made as to the trace segment that is about to be produced, namely, segment 2 or segment 3. If so, the digital word representing $Y_n + 2\Delta Y/4$ is given to the beam comparator. Then the value $\Delta Y/4$ is added to the quantity $Y_n + 2\Delta Y/4$ to provide the value $Y_n + 3\Delta Y/4$. A further inquiry as to the segment about to be produced is then made, that is, segment 3 or segment 4. If affirmative, the digital word for the quantity $Y_n + 3\Delta Y/4$ is given to the beam comparator. Then the value $\Delta Y/4$ is added to the quantity $Y_n + 3\Delta Y/4$ to provide the value $Y_n + 4\Delta Y/4$. An inquiry is then made as to whether the apparatus is about to produce segment 4. If the latter, the digital word for the quantity $Y_n + 4\Delta Y/4$ is given to the beam comparator. Then, the algorithm provides for the stopping of further such inquiries and directs the apparatus to go back and wait for the next effective retrace period of the divide by 1140 counter.

In FIG. 7, there is shown the beam comparator circuit of the FIG. 1 apparatus. As shown, the circuit of FIG. 7 include a first group of flip-flops 30, a second group of flip-flops 31, a first digital comparator 32, a second digital comparator 33, an AND gate 34, flip-flops 35, 36 and 37, an EXCLUSIVE OR gate 38, a one-shot 39, and an OR gate 40. The output of the OR gate 40 is connected to an AND gate 42 which is, in turn, connected to the blanking control circuit 16, as shown in FIG. 1. A second input to the AND gate 42 is an enable signal discussed more in detail hereinafter.

Specifically, the circuit arrangement of FIG. 7 is operative to turn on the cathode ray beam of the CRT 2 when the vertical sweep or effective raster line as seen in FIGS. 2A and B crosses the first Y value, and is operative to turn off the beam when the sweep line crosses the second Y value. If the two Y values are equal, the one-shot 29 momentarily turns on the beam when the common Y value is crossed.

The control logic circuitry 12, as mentioned hereinbefore, includes a divide by 1140 counter, which provides, in addition to the signals previously mentioned, a signal that is in synchronism with the sweep signal applied to the deflection plates 4 of the CRT 2. This signal count is applied to the clock inputs of each of the digital comparators 32 and 33. Retrace signals also are applied from the control logic circuitry 12 to the reset terminals of the flip-flops 35, 36 and 37 to reset them. With this arrangement, the sweep of the cathode ray beam effectively is controlled by the counter. The sweeps respectively occur during counts 0 to 1024 of the counter and the beam repetitively is held in retrace for counts 1025 through 1139.

Figure 6:
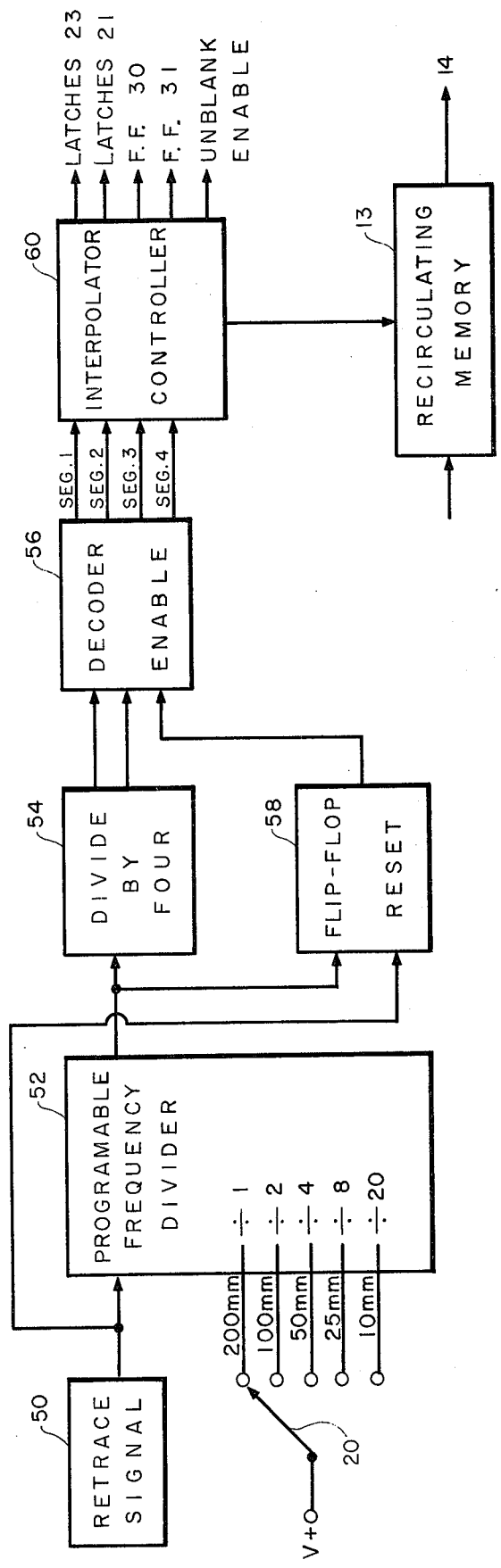
FIG. 6 is a block diagram of circuit structure for effecting the control in accordance with the present invention.

In FIG. 6, there is shown a block diagram of circuit means for effecting a control of the correlation of the unblanking of the recording beam with the selected speed of the record member. These control circuit elements are included in the control logic 12 shown in FIG. 1.

As was hereinbefore mentioned, means are provided for causing the cathode ray beam to sweep, repeatedly, across the fiber optic strip in the face of the CRT 2. That signal is illustrated in curve A of FIG. 4 and is shown as a sawtooth lay form. The rising portion of the signal represents the sweep drive portion of the signal while the downward slope represents the retrace drive. It will be recalled that the sawtooth wave signal is correlated through the control logic 12. In that logic circuit, there is a counter which, in turn, provides a clocking signal for other parts of the system. As a function of that counter, there is developed a square wave signal, illustrated in curve B of FIG. 4, which is coincident with the retrace portion of curve A. That retrace signal, curve B, is shown as a block 50 of FIG. 6. That signal is applied as input signal to a programmable, digital frequency divider 52. In that divider 52, means are provided for dividing the frequency of the retrace signal by any one of several factors commensurate with the selected speed of the record member. In an exemplary structure constructed in accordance with the present invention, the maximum speed of the record member is established at 200 millimeters per second. Other selectable speeds for the drive of the record member are integral subdivisions of the 200 millimeters per second; i.e., 100 millimeters per second, 50 millimeters per second, 25 millimeters per second and 10 millimeters per second. The switches 20 illustrated in FIG. 1 are also shown in FIG. 6 as representing each of those selectable speeds. The operation of a selected one of those switches determines the divisor by which the retrace signal frequency is to be divided. In a preferred embodiment, the switches 20 are, in effect, ganged with the switches, not shown, which may be used to actually select the speed of the operation of the record member. If the selected speed for the operation of the record member is the maximum speed, or 200 millimeters per second, the switch corresponding thereto would be closed and the corresponding divisor is 1. Under those conditions, the frequency of the output signal from the programmable frequency divider will be identical to the frequency of the input signal. Accordingly, each scan of the cathode ray beam will be enabled for an unblanking signal as shown in FIG. 2A. If, on the other hand, a slower speed were chosen for the drive of the record member, say, for example, 100 millimeters per second, the corresponding element of the switch 20 would be closed and the divisor would be 2. Since the speed of the record member had been divided by 2, so the retrace signal frequency is divided by 2 to produce a control signal frequency one-half that of the retrace signal frequency. Similarly, if the selected speed were one-fourth that of the maximum speed, that is, 50 millimeters per second, the corresponding element of switch 20 would be closed and the frequency divisor would be 4, and so on for the other selectable speeds. In each case, the same divisor is used for the selected speed and for the division of the frequency of the retrace signal from the source 50.

In the exemplary embodiment hereinbefore set forth, means are provided for interpolating between two measured points to derive a number of intermediate values between the two measured points whereby to provide a smoother appearer curve without the need of the significantly larger memory for the storage of a larger number of measured points. All of that aspect of the circuit is described and claimed in the aforementioned co-pending application Ser. No. 627,794, now U.S. Pat. No. 4,038,668. In that exemplary embodiment, there are four interpolations for each pair of measured data points. Thus, in accordance with the present invention, the divided retrace signal constituting the output of the programmable frequency divider is applied to a divide by 4 circuit 54. The divide by 4 circuit 54 provides a series of signals which are applied as input to a decoder circuit 56. The decoder 56 is a logic circuit which converts the input signal to a sequence of signals on four successive output lines. The output signal from the programmable frequency divider is also applied as an input signal to a flip-flop circuit 58. The retrace signal from the surce 50 is also applied to the input of the flip-flop circuit 58 as a reset signal. The output of the flip-flop circuit is connected to the decoder 56 as an enable signal. The sequential signals on the four output lines of the decoder 56 correspond, in time sequence, to four successive effective sweep signals of the cathode ray beam during which the interpolated line segments are applied as unblanking signals to those sweeps. Those four signal lines are connected to the input of an interpolator controller 60. The interpolator controller 60 is also a digital logic circuit which performs the control functions illustrated in the algorithm of FIG. 5. As a part of the control function of the interpolator controller 60, there are several output control signals to which reference has already been made in connection with FIGS. 1, 3 and 7. That is, a control signal is emitted by the controller 60 to control the operation of the recirculating memory 13 as illustrated in FIG. 1. That signal controls the fetching of new data from the recirculating memory for application to the latches 21 and 23 of the computational circuit shown in FIG. 3. Additionally, it will be recalled that control signals were applied to the latches 21 and 23. These control signals are also supplied by the interpolator controller 60. Similarly, in FIG. 7, there is a control signal applied to the flip-flops 30 and 31 of the beam comparator circuitry. These signals are identified in FIG. 7 as store first in point and store second in point, respectively. These signals are also supplied from the interpolator controller 60. At the output end of the beam comparator circuit shown in FIG. 7, there is an AND gate 42, one input of which is the unblanking signals derived from the digital comparators 32 and 33. The other input of the AND gate 42 is an unblank enable signal which is supplied by the interpolator controller 60 and is commensurate with the effective raster scan lines of the recording beam.

OPERATION OF THE INVENTION

In previous recorders of the type wherein a scanning beam is gated, or unblanked, to make a trace on a moving photosensitive record member, the scanning beam is swept across the face of the recording area at a fixed frequency, or repetition rate. In such systems, the recording beam is unblanked during each sweep thereof in accordance with the input data signals. As was previously mentioned, if the record member is always driven at the same speed the resulting record will always be of a constant intensity. When, however, the recording system provides a selection of different speeds for the record member, and nearly all do, a problem of intensity variation is also introduced as a result of the variation in the number of lines per mm being laid down on the record member. With a fixed scanning frequency, the lines per mm on the record member may be expressed as:

$$\text{lines per mm (LPMM)} = \frac{\text{scan frequency}}{\text{record speed}}$$

where the scanning frequency is in scan lines per second, and record speed is in mm per second. Thus, it may be seen that with a constant scanning frequency, as the record speed decreass, the lines per mm increase. With a constant intensity light source, it may be seen that as the number of lines per mm increases, the intensity of the exposure of the photosensitive paper also increases. If the system is adjusted to produce a desirable trace on the record member at the highest available speed, as the number of lines per mm increases, the trace on the record member will be overexposed. Conversely, if the system is adjusted to provide a good trace at the minimum speed, as the number of lines per mm decreases, the trace on the record member will be underexposed producing faint traces. To choose an intermediate speed for the optimum trace merely reduces the foregoing problem but does not eliminate it. In accordance with the present invention, means are provided for eliminating the problem. As hereinbefore mentioned, the same division factor is applied to the control of the unblanking of the scan lines as is applied to the control of the record member speed. Thus, the effective scan line frequently can be expressed as $$\text{effective scan frequency} = \frac{\text{scan frequency}}{n}$$

Using this equation to substitute the effective scan frequency for the original scan frequency in the first equation, we then have:

$$\text{LPMM} = \frac{\frac{\text{scan frequency}}{n}}{\frac{\text{max record speed}}{n}}$$

From this last equation, it may be seen that when the scan frequency and the record speed are divided by the same factor, the lines per mm remains constant irrespective of the speed of the record member. If the lines per mm remain constant, then the intensity of the trace will remain constant.

In the apparatus hereinbefore described embodying the present invention, the system is basically adjusted to provide a good trace intensity at the highest speed of the record member. In the exemplary model, that highest speed was 200 millimeters per second. Means are provided for selecting submultiples of that speed, i.e., 100 millimeters per second, 50 millimeters per second, 25 millimeters per second and 10 millimeters per second.

At the highest speed of operation, the hereinbefore described frequency dividing apparatus is substantially transparent, division by a factor of 1 does not affect the output of the recording instrument. At the maximum speed for the record member, the record will be produced in accordance with the diagram shown in FIG. 2A. With reference to FIG. 4 as well as FIG. 2A, it may be seen that each successive scan line of the scanning beam is enabled to be unblanked in accordance with the applied data signals. In FIG. 4, curves C, D, E and F correspond to the signals emitted on the four successive lines at the output of the decoder 56 in FIG. 6. These corresponding to the enabing signals apply to the interpolator controller to permit the four successive line segments of the interpolated values to be applied during the four successive scan lines of the recording beam.

On the other hand, when the record member is driven at one of the lower speeds, for example, at one-half the maximum speed, the frequency division operation becomes significant. The result of this division is also illustrated in FIG. 2B and FIG.4. In FIG. 2B, it may be seen that only every second sweep of the scanning beam is enabled for unblanking. This is illustrated in FIG. 4 with reference to curves C', D', E' and F' and comparing the signals appearing thereon with the scan lines of curve A. Again, curves C', D', E' and F' represent the timing signals corresponding to line segments 1, 2, 3 and 4 as they appear at the output of decoder 56 when the divisor is 2. From the comparison of the curves of FIG. 4, it may be seen that the repetition rate of the scan lines remains constant whether the record member is being driven at full speed or some lesser speed, i.e., half speed. However, it may be seen that only the alternate scan lines are enabled when the record member is driven at half speed. The signals appearing on curves C', D', E' and F' of FIG. 4 accomplish this, when applied to the interpolator controller 60.

The circuit components shown in FIG. 6 are illustrative of apparatus embodying the present invention. Curves B of FIG. 4 represent the timing pulses derived from the retrace portion of the line scan driver signals appearing in curve A of FIG. 4. These retrace signals are represented by the source 50 in FIG. 6 and are applied to the programable frequency divider. These retrace signals are of constant frequency irrespective of the speed of the record member. Associated with the programmable frequency divider is the speed select switch 20 which is operated conjointly with the switch (not shown) by which the actual speed of driving of the record member is effected. Included in the programmable frequency divider is a logic circuit arrangement for effecting the several divisional operations. The several positions of the switch 20 effectively enables a selected one of the divisional operations in accordance with the selected speed of the record member. When the record member is being driven at its maximum speed, i.e., 200 millimeters per second, the programmable frequency divider passes the retrace signals through at the same rate at which they occurred at the source 50. The signals applied to the divide by 4 circuit 54, output signals which, when applied to the decoder 56, provide the timing signals corresponding to curves C, D, E and F of FIG. 4 when the system is operated at maximum speed. The flip-flop 58 provides an output signal to enable the decoder 56 for each of the signals output by the programmable frequency divider. The retrace signal from the source 50 is applied to the flip-flop circuit 58 to reset the flip-flop after one scan. At the highest selectable speed, the decoder is enabled during each scan line. The signals output from the decoder 56 applied to the inerpolator controller 60 produce the several control signals as noted. In the interpolator controller 60 provision is made for counting and keeping track of which of the four line segments will be the next to be operated upon in order to control the updating of the latches 21 and 23 from the recirculating memory 13 after the fourth line segment has been transferred to the digital comparator. Also from the interpolator controller 60 control signals are applied to the recirculating memory to gate signals out of that recirculating memory into the respective latches 21 and 23. The signals from the calculator of FIG. 3 to the beam comparator of FIG. 6 is also under the control of signals from the interpolator controller. The signal output lead to the flip-flop 30 is applied to the input of flip-flop 30 indicated as "store first end point." Similarly, the output signal from the interpolar controller 60 marked flip-flop 31 is applied to the corresponding terminal of the flip-flop 31 labeled "store second end point." These control signals effectively control the gating of the calculated line segment values from the computational circuit 14 of FIG. 3 to the beam comparator circuitry. The digital values stored in the flip-flops 30 and 31 are compared with the digital values from the raster counter (a portion of the control logic circuit 12) to produce output pulses representative of the data signals. Those signals trigger corresponding flip-flops 35 and 37, the Q outputs of which are applied to the input terminals of an exclusive OR gate 38. The first of the flip-flops 35 or 37 which produces an output signal on its Q output terminal causes a logical high output signal to begin at the output of the exclusive OR gate 38. When the second of the two signals occurs, the high output signal from the exclusive OR gate 38 is terminated. Thus, the length of the output pulse from the exclusive OR gate is commensurate with the time difference in the occurrence of the output pulses from the two gate flip-flops 35 and 37. The output pulse from the gate 38 is passed through an OR gate 40 to an AND gate 42. Another signal which is output from the interpolator controller 60 is an unblank enable signal which is applied to the second input terminal of the AND gate 42. The output signal from the gate 42 is applied to the blanking control circuit 16 (FIG. 1) for the control of the unblanking of the scanning beam of the CRT 2. When, as hereinbefore noted, the record member is being driven at its highest selectable speed, the unblank enable signal occurs for each of the scan lines.

When one of the lower speeds, which for purposes of illustration will be taken as one-half maximum speed or 100 millimeters meters per second, the operation of the programmable frequency divider becomes significant. The retrace signals from the source 50 continue to be supplied to the programmable frequency divider at the same rate as before. Now, however, the pulses emitted from the programmable frequency divider are supplied at one-half the repetition rate. Similarly, for the other selectable speeds, the output pulses from the programmable frequency divider would be emitted at a rate which is one-fourth, one-eighth, one-twentieth of the rate at which the pulses are supplied to the programmable frequency divider. Again, the divide by 4 circuit 54 produces a set of signals which when applied to the decoder provide the four timed signals such as appear on curves C', D', E' and F' of FIG. 4 for a selected speed of one-half the maximum normal speed. The one-half frequency signals output from the programmable frequency divider 52 are applied to the flip-flop 58 to enable the decoder only on the occurrence of one of the signals output by the programmable frequency divider 52. In order to assure that the pulses emitted by the decoder 56 are up to more than one scan line duration, the occurrence of the retrace signals from the source 50 reset the flip-flop 58 removing the enable signal on the occurrence of the next retract pulse. The signals output from the decoder 56 are again applied to the interpolator controller 60 which produces the control signals to the latches 21 and 23, the flip-flops 30 and 31, the unblank enable signal to the gate 42 and the update control signal to the recirculating memory 13. Thus, when the record member is driven at half speed, data is extracted from the recirculating memory 13 at one-half the rate at which it was extracted for maximum speed of the record member. Accordingly, it may be seen from FIG. 4 that a single sample period is twice as long when the record member is being driven at half speed as the sample period when the record member is being driven at maximum speed. The sampled data is supplied to the computational circuit 14 (FIG. 3) at one-half the rate and the calculated interpolation values are supplied to the flip-flops 30 and 31 at half the rate while the digital comparators 32 and 33 may be operated and reset at the full raster rate and the flip-flops 35 and 37 are reset at the full raster rate, the output signals from the beam comparator circuit are supplied to the unblanking circuitry only on alternate cycles as determined by the occurrence of the unblank enable signal applied to the AND gate 42. Similarly, for even slower speeds, the unblank enable signal would be applied to the gate 42 only on every fourth, eighth or twentieth scan interval.

While the present invention has been described in association with the interpolated output signals, it should be clear to one skilled in the art that the invention is equally applicable in a recording system wherein successive data lines are laid down directly from the recirculating memory without the intervention of an interpolatin technique. Thus, there has been provided an improved recording system of the scanning beam type wherein a constant intensity of recording traces are obtained notwithstanding a wide varition in the speed at which the record member is being driven.

The embodiments of the invention in which an exclusive property or privilege is claimed are defined as follows:

1. In a graphic recording system wherein a scanning beam, operated at a constant scanning repetition frequency, is selectively unblanked in response to input signals to produce a trace representative of the input signal on a moving record member, means for providing a substantially constant trace intensity on said record member notwithstanding a selectively variable speed of movement of said record member, said means comprising:
   a speed correlated selecting means,
   a frequency division means responsive to said speed correlated selecting means,
   means for producing a signal having a frequency equal to said scanning repetition frequency and being connected to an input of said frequency division means,
   said frequency division means being operative to provide an output signal the frequency of which is a division of said scanning repetition frequency correlated to the selected speed of movement of said record member, and
   enabling means responsive to said output signal to enable the unblanking of said scanning beam at a repetition frequency equal to said frequency of said output signal correlated with the selected speed of movement of said record member.

2. In a graphic recording system wherein a scanning beam, operated at a constant scanning repetition frequency, is selectively unblanked in response to input signals to produce a trace representative of the input signals on a moving record member, means for providing a substantially constant trace intensity on said record member notwithstanding a selectively variable speed of movement of said record member, said means comprising:
   a speed correlated selecting means,
   a frequency division means responsive to said speed correlated selecting means, said frequency division means including means defining a plurality of divisors, each of said divisors being correlated to a corresponding one of the selectable speeds for the movement of said record member,
   means for producing a signal having a frequency equal to said scanning repetition frequency and being connected to an input of said frequency division means,
   said frequency division means being operative to provide an output signal the frequency of which is a division of said scanning repetition frequency determined by a speed correlated one of said divisors, and
   enabling means responsive to said output signal to enable the unblanking of said scanning beams at a repetition frequency equal to said frequency of said output signal.

3. A graphic recording system as set forth in clain 2 wherein said record member is arranged to be selectively driven at any of a plurality speeds including a maximum speed and a plurality of other speeds which are submultiples of said maximum speed determined by progressive divisors,
   and wherein said correlated divisors of said frequency division means are identical to the speed determining divisors.

* * * * *